United States Patent
Yoon et al.

(10) Patent No.: US 8,153,904 B2
(45) Date of Patent: Apr. 10, 2012

(54) SUBSTRATE PANEL INCLUDING INSULATION PARTS AND BUS LINE

(75) Inventors: Hee-Soo Yoon, Suwon-si (KR);
Chang-Hwan Choi, Seongnam-si (KR);
Soo-Heung Lee, Daejeon (KR);
Jong-Soo Yoo, Cheongju-si (KR);
Dal-Hyun Yoo, Hwaseong-si (KR);
Ji-Chul An, Goyang-si (KR);
Jeong-Hoon Park, Suwon-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 770 days.

(21) Appl. No.: 12/213,701

(22) Filed: Jun. 23, 2008

(65) Prior Publication Data

US 2009/0139746 A1    Jun. 4, 2009

(30) Foreign Application Priority Data

Nov. 30, 2007 (KR) .................. 10-2007-0123935

(51) Int. Cl.
*H05K 1/00* (2006.01)
*C25D 5/16* (2006.01)
(52) U.S. Cl. ........... 174/258; 174/255; 205/95; 205/157
(58) Field of Classification Search .......... 174/250–268; 205/96, 157
See application file for complete search history.

(56) References Cited

U.S. PATENT DOCUMENTS

| | | | | |
|---|---|---|---|---|
| 6,242,103 | B1* | 6/2001 | Farnworth et al. | 428/458 |
| 6,628,523 | B2* | 9/2003 | Kobayashi et al. | 361/736 |
| 7,284,224 | B2* | 10/2007 | Wang et al. | 174/261 |
| 7,919,715 | B2* | 4/2011 | Fan | 174/261 |
| 2006/0232948 | A1* | 10/2006 | Haager et al. | 361/752 |
| 2009/0139747 | A1* | 6/2009 | Yoon et al. | 174/250 |

* cited by examiner

*Primary Examiner* — Zachary M Pape

(57) ABSTRACT

A substrate panel is disclosed. The substrate panel may include a clamp contact, a bus line formed at a distance from the clamp contact, and a plurality of substrate units supplied with an electric current by way of the bus line, where an insulation part may be formed between the clamp contact and the bus line, through which electricity may not flow.

2 Claims, 5 Drawing Sheets

SUBSTRATE PANEL INCLUDING INSULATION PARTS AND BUS LINE

CROSS-REFERENCE TO RELATED APPLICATIONS

This application claims the benefit of Korean Patent Application No. 10-2007-0123935 filed with the Korean Intellectual Property Office on Nov. 30, 2007, the disclosure of which is incorporated herein by reference in its entirety.

BACKGROUND

1. Technical Field

The present invention relates to a substrate panel having substrate units coupled thereon.

2. Description of the Related Art

In the manufacturing process for a printed circuit board, plating processes are of utmost importance. In proceeding with such plating processes, clamp contacts 111, 112 may be located at the edges of a substrate panel 10, as illustrated in FIG. 1, by which to supply an electric current to the substrate units 121. The clamp contacts 111, 112 are the points to which a clamp is coupled, and thus may be changed in accordance to the position where the clamp is coupled. The clamp contacts 111, 112 may not necessarily be externally marked. There may be multiple substrate units 121, and there may be smaller unit substrates coupled inside each substrate unit 121.

The amount of current supplied to each substrate unit 121 may vary according to its position, so that deviations occur in the degree of plating. This can be caused by a greater amount of electric current flowing through those bus lines that are closer to the clamp contacts.

FIG. 2 is a diagram representing the density of electric current after plating a conventional substrate panel 10 in a plating bath. The more closely spaced lines denote areas of higher current densities, and it can be seen that a greater amount of electric current is distributed to substrate units closer to the clamp contacts. As a result, the electric current can be distributed unevenly over the substrates, as in the diagram shown in FIG. 2. This may occur because bus lines 122 located in positions far from the clamp contacts 111, 112 may provide a relatively lower supply of electric current.

SUMMARY

An aspect of the invention provides a substrate panel, in which the entire panel can be plated uniformly.

Another aspect of the invention provides a substrate panel that includes a clamp contact, a bus line formed at a distance from the clamp contact, and a plurality of substrate units supplied with an electric current by way of the bus line, where an insulation part is formed between the clamp contact and the bus line, through which electricity may not flow.

The insulation part can be a hole.

Additional aspects and advantages of the present invention will be set forth in part in the description which follows, and in part will be obvious from the description, or may be learned by practice of the invention.

DETAILED DESCRIPTION

Figure 1:
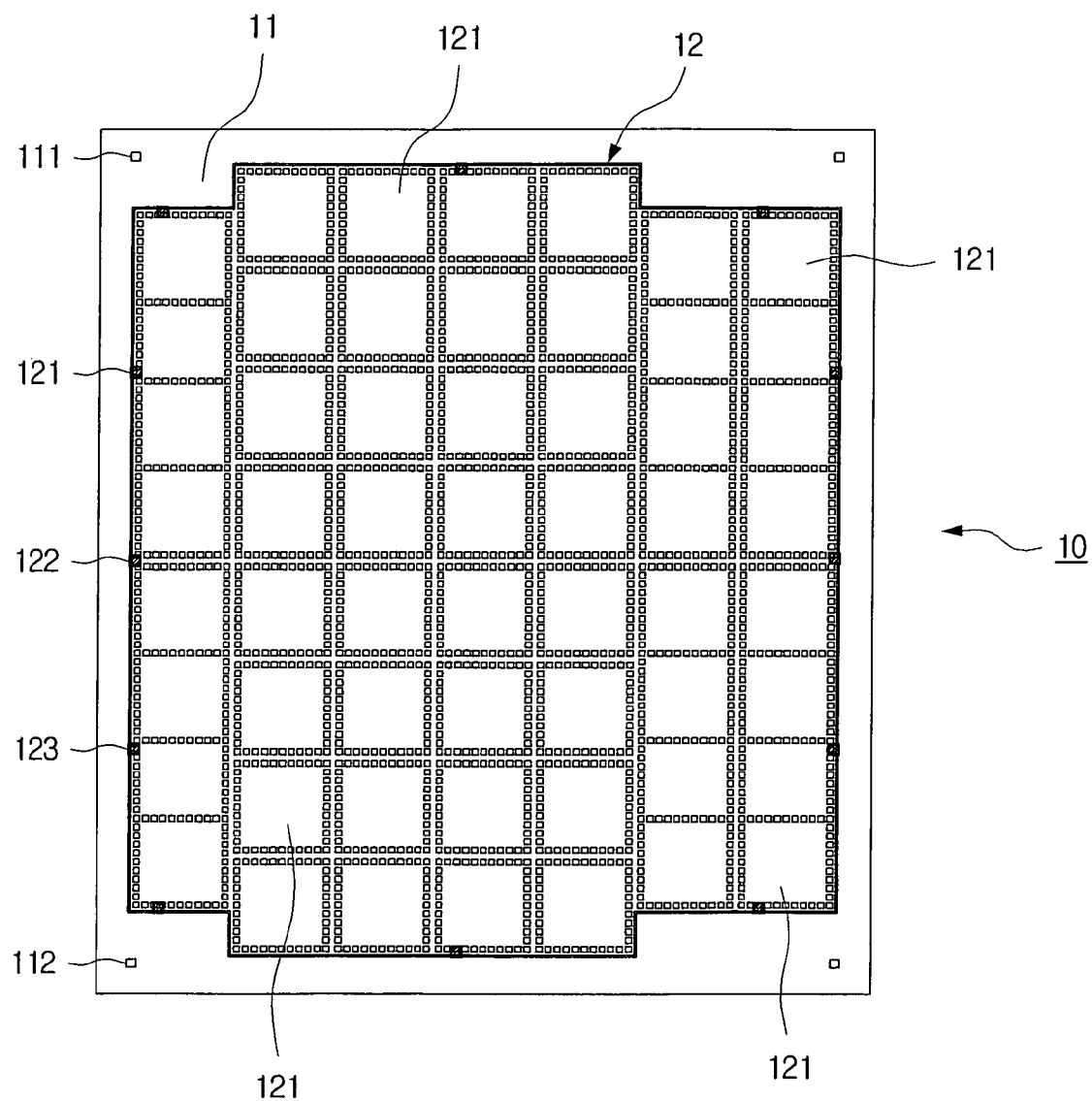
FIG. 1 is a plan view illustrating a substrate panel and substrates coupled together according to the related art.
Figure 2:
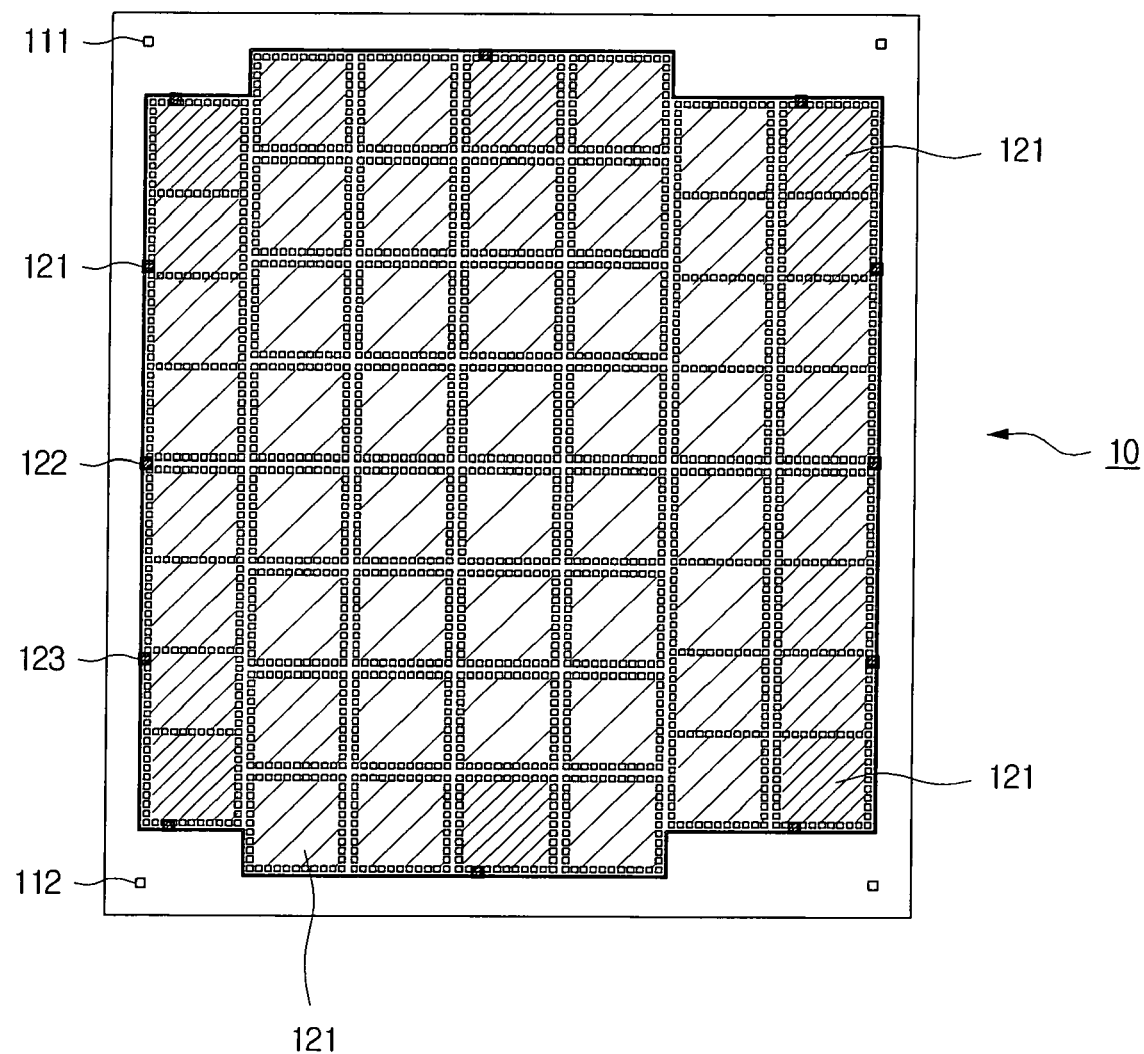
FIG. 2 is a diagram representing the distribution of an electric current in substrates according to the related art.

The substrate panel according to certain embodiments of the invention will be described below in more detail with reference to the accompanying drawings. Those components that are the same or are in correspondence are rendered the same reference numeral regardless of the figure number, and redundant explanations are omitted.

Figure 3:
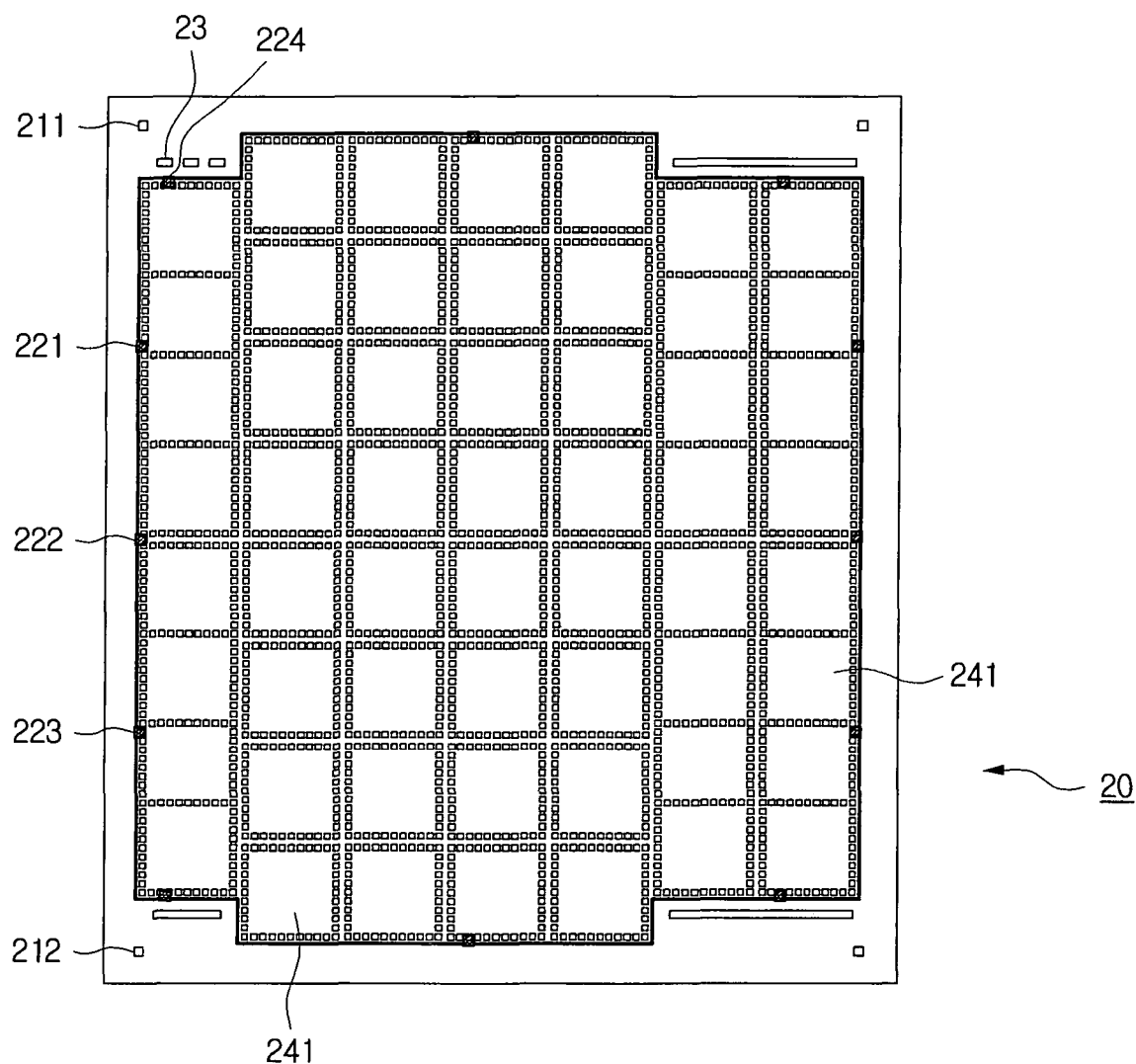
FIG. 3 is a plan view of illustrating a substrate panel and substrates coupled together according to an embodiment of the invention.
Figure 4:
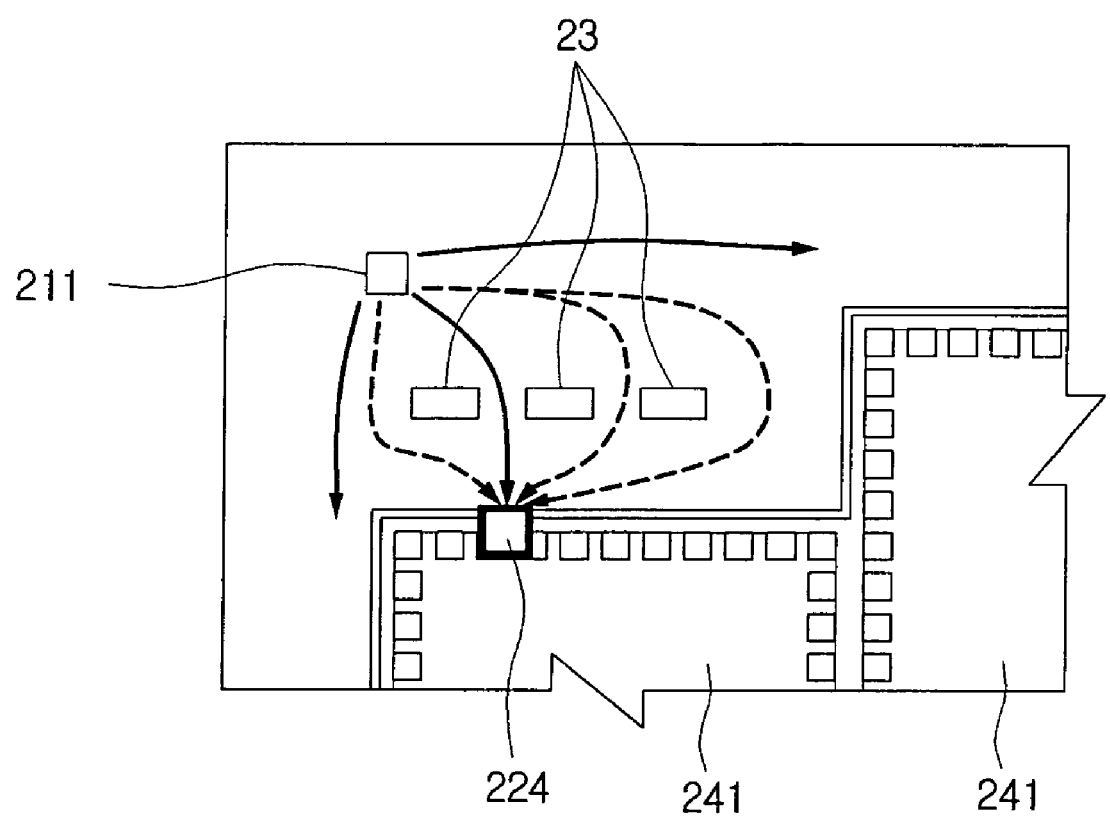
FIG. 4 is a magnified view illustrating a substrate panel and substrates coupled together according to an embodiment of the invention.

FIG. 3 is a plan view of illustrating a substrate panel and substrates coupled together according to an embodiment of the invention, and FIG. 4 is a magnified view illustrating a substrate panel and substrates coupled together according to an embodiment of the invention. In FIGS. 3 and 4, there are illustrated a substrate panel 20, a first clamp contact 211, a second clamp contact 212, a first bus line 221, a second bus line 222, a third bus line 223, insulation parts 23, and substrate units 241.

As shown in FIG. 3, the substrate panel 20 may pass through a plating bath, with substrate units 241 coupled to the middle. The plating bath may contain a plating liquid, in which the metal to be plated exist in the form of ions. An outside clamp may be coupled to the first and second clamp contacts 211, 212 of the substrate panel 20 to supply an electric current. The electric current may be supplied through the first and second clamp contacts 211, 212 to each of the substrate units 241, where the supply paths are implemented by the first to third bus lines 221-223.

Figure 5:
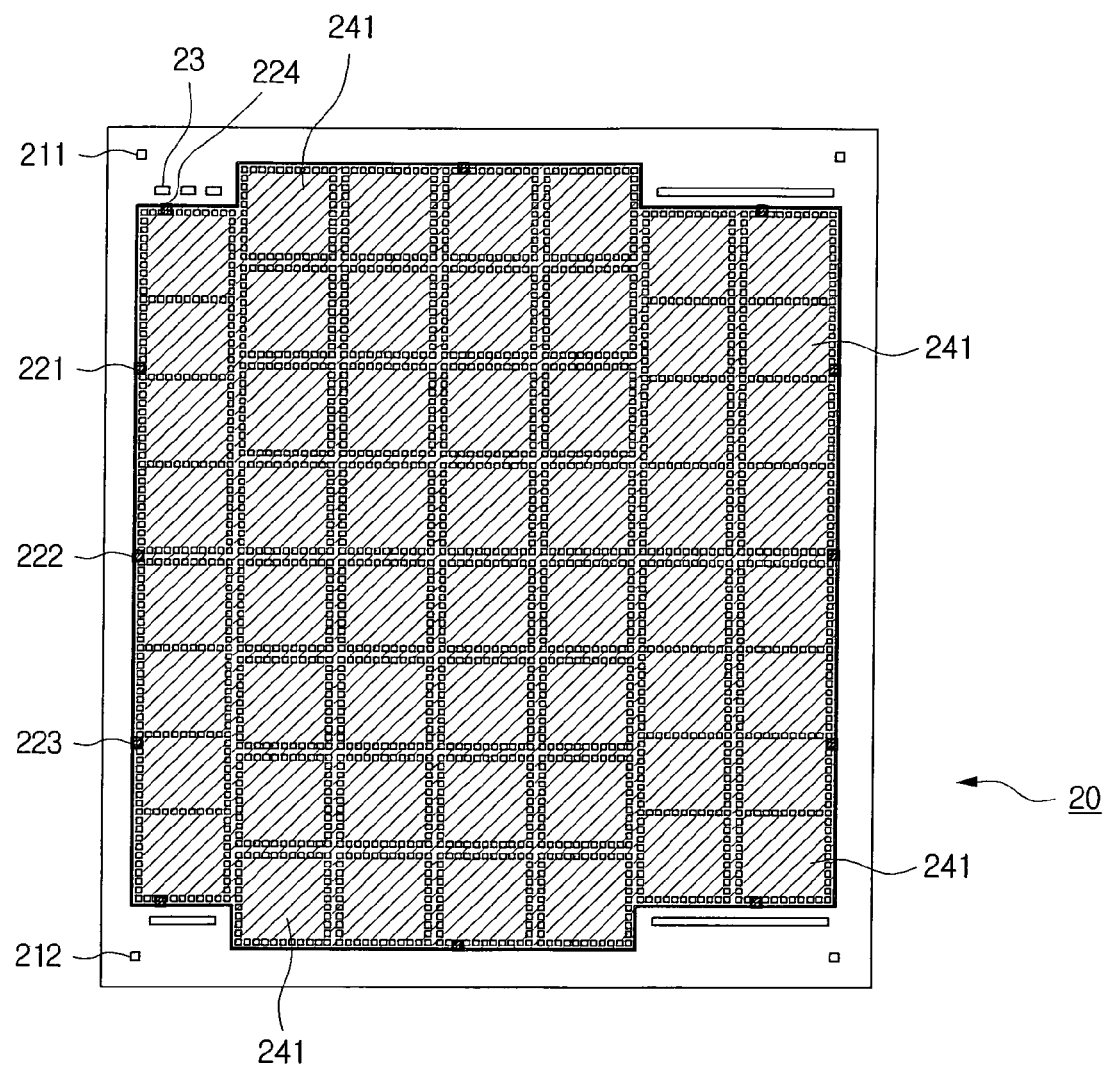
FIG. 5 is a diagram representing the distribution of an electric current in substrates according to an embodiment of the invention.

FIG. 4 is a magnified view of a portion of FIG. 3, where it is seen that insulation parts 23 may be formed in the substrate panel 20 between the first clamp contact 211 and a fourth bus line 224. These insulation parts 23 may obstruct the electric current directly flowing to the fourth bus line 224 and force the current to detour. As a result, the electric current may be distributed uniformly over the entire substrate panel 20. Substrate units were coupled onto a substrate panel 20 in which insulation parts 23 were formed, as described above, and the distribution of electric current was measured. The results obtained are similar to the diagram illustrated in FIG. 5, in which a uniform distribution is shown. The insulation parts 23 can be positioned between a clamp contact and a bus line positioned in proximity to the clamp contact.

Such insulation parts 23 can be such that do not allow plating over the corresponding positions, during the manufacture of the substrate panel 20. The insulation parts 23 can be implemented in the form of holes perforated in an edge of a substrate panel 20.

According to certain aspects of the invention as set forth above, insulation parts may be formed in a substrate panel between the clamp contacts and the bus lines. As the electric current detours around the insulation parts, the current may readily be supplied to bus lines located relatively far away.

While the spirit of the invention has been described in detail with reference to particular embodiments, the embodiments are for illustrative purposes only and do not limit the invention. It is to be appreciated that those skilled in the art can change or modify the embodiments without departing from the scope and spirit of the invention.

What is claimed is:

1. A substrate panel comprising:
   a clamp contact suppliable with an electric current;
   a plurality of bus lines formed at a distance from the clamp contact;
   a plurality of substrate units suppliable with an electric current from the clamp contact by way of the plurality of bus lines; and
   an insulation part formed between the clamp contact and the plurality of bus lines, the insulation part configured to force an electric current flowing from the clamp contact to the plurality of substrate units to detour,
   the insulation part being positioned between the clamp contact and a bus line closest to the clamp contact of the plurality of the bus lines.

2. The substrate panel of claim 1, wherein the insulation part is a hole.

* * * * *